United States Patent [19]

Nicollini et al.

[11] Patent Number: 4,714,895

[45] Date of Patent: Dec. 22, 1987

[54] INTERNAL ALL-DIFFERENTIAL OPERATIONAL AMPLIFIER FOR CMOS INTEGRATED CIRCUITS

[75] Inventors: Germano Nicollini, Piacenza, Italy; Daniel Senderowicz, Berkeley, Calif.

[73] Assignee: SGS Microelettronica SpA, Catania, Italy

[21] Appl. No.: 918,101

[22] Filed: Oct. 14, 1986

[30] Foreign Application Priority Data

Oct. 14, 1985 [IT] Italy ................................ 22475 A/85

[51] Int. Cl.[4] .............................................. H03F 3/45
[52] U.S. Cl. ..................................... 330/258; 330/253
[58] Field of Search ............... 330/252, 253, 258, 259, 330/260, 261

[56] References Cited

U.S. PATENT DOCUMENTS 4,656,437  4/1987  Saari ..................................... 330/258

Primary Examiner—Gene Wan
Attorney, Agent, or Firm—Wenderoth, Lind & Ponack

[57] ABSTRACT

The amplifier comprises two like CMOS cascode circuits, each having a first and a second transistors with channels having a first plurality and a third and fourth transistors with channels having the opposite polarity, the drain of the first transistor being connected to the source of the second transistor, and the drain of the fourth transistor being connected to the source of the third transistor, the drains of the second and of the third transistors being connected to each other end composing one of the output terminals of the amplifier, the sources of the first transistors being connected to each other and to the drain of a fifth transistor with a channel having the first polarity, the source of which is fed by a first supply voltage, the sources of the fourth transistors of the two cascode circuits being fed by a second supply voltage.

6 Claims, 5 Drawing Figures

INTERNAL ALL-DIFFERENTIAL OPERATIONAL AMPLIFIER FOR CMOS INTEGRATED CIRCUITS

BACKGROUND OF THE INVENTION

The present invention relates to an all-differential operational amplifier, to be implemented as a so-called "internal" amplifier in monolithic integrated circuits manufactured with the CMOS technique, typically for integrators.

Among operational amplifiers built-in in monolithic integrated circuits, only very few are intended to drive a load which is external to the circuit. For these amplifiers (so-called "output buffers"), the load is unpredictable both in nature and magnitude (as an example, resistive to less than 1 kiloohm or capacitive to hundreds of picofarads), and furthermore they must be able to withstand a wide common-mode signal on the inputs.

Most operational amplifiers employed in MOS integrated circuits, instead, drive internal loads, which are defined exactly during the design phase, often of a merely capacitive type (of a few picofarads): these are so-called "internal" operational amplifiers, which furthermore are not necessarily requested to withstand common-mode voltages on the inputs. Typically, an amplifier of this kind is used as an integrator. From these operational amplifiers, the following main properties are expected:

(a) a high open-loop gain;
(b) predisposition to drive merely capacitive loads;
(c) short settling time;
(d) wide excursion of the output signal;
(e) low dissipation of power;
(f) low equivalent input noise;
(g) high rejection of disturbances superimposed on the power supply;
(h) small occupied area.

Recently the use has spread of amplifiers with a differential output, in which the output signal is not composed of the difference between a single voltage and a fixed reference (as in single-ended amplifiers), but of the difference between the two outputs, which turn out to be symmetrical with respect to said fixed reference. This reference is set to a value which is equidistant from the values of the power supplies. In these amplifiers, an important problem is therefore that of designing a feedback loop which forces the common-mode of the output voltage to a voltage which is close to the reference, so that the excursion of the output can be symmetrical.

The use of all-differential amplifiers has spread mostly because in this way a much better rejection of the power supply disturbances is obtained, and also because an excursion of the output signal is available which is double with respect to the one which can be obtained with single-ended amplifiers.

Some embodiments of all-differential operational amplifiers are described in the article "MOS Operational Amplifier Design—A Tutorial Overview", by P. R. Gray and R. G. Mayer, in *IEEE Journal of Solid - State Circuits*, vol. SC-17, No. 6, December 1982.

In the NMOS technology, these amplifiers are manufactured in two stages, to obtain the high gain required. Examples of these two-stage amplifiers are also found in the CMOS technology. These two-stage amplifiers have the disadvantage of requiring a compensating capacitor which is proportional to the load capacity; this compensation, besides occupying a not insignificant area, can be critical for the stability of the amplifier, and furthermore varies according to the specific situation in which the amplifier is employed, since the load will be generally different. The compensating capacity also extends the settling time as the load capacity increases.

It is known to overcome these disadvantages in an integrated differential amplifier, by employing a differential input stage followed by a "folded cascode" stage, which is the actual stage where the gain is developed, i.e. where the high impedance node is located. In this way the compensating capacitor is eliminated, thus eliminating the stability problems, but the settling time turns out to be extended in any case by the load capacity itself.

SUMMARY OF THE INVENTION

The present invention has the aim of improving the known single-stage solution, reducing the number of transistors used, and thus reducing both the occupied area and the dissipated power, though maintaining characteristics which are equal to those of the known solution.

This aim is achieved by the invention, together with other objects and advantages which will become better apparent hereinafter, with an internal all-differential operational amplifier for integrated circuits of the CMOS type, comprising two CMOS cascode circuits, identical to each other, each having a first and a second transistors with a channel having a first polarity and a third and fourth transistors with a channel having the opposite polarity, the drain of the first transistor being connected to the source of the second transistor, the drain of the fourth transistor being connected to the source of the third transistor, the drains of the second and of the third transistor being connected to each other and forming one of the output terminals of said amplifier, the sources of the first transistors of the two cascode circuits being both connected to the drain of a fifth transistor having said first polarity, the source of which is fed by a first supply voltage, and the sources of the fourth transistors of the two cascode circuits being fed by a second supply voltage, the two input signals being applied, by means of capacitor and switching means simulating input resistors, to the respective gates of said two first transistors, the other three gates of each cascode circuit being biased by respective fixed biasing voltages, the gate of the fifth transistor being biased by a dedicated fixed biasing voltage by means of capacitor and switching means constituting a common-mode feedback circuit.

BRIEF DESCRIPTION OF THE DRAWINGS

A preferred embodiment of the invention will now be described, given as a non-limitative example, with reference to the accompanying drawings, where.

DESCRIPTION OF THE PREFERRED EMBODIMENTS

Figure 1:
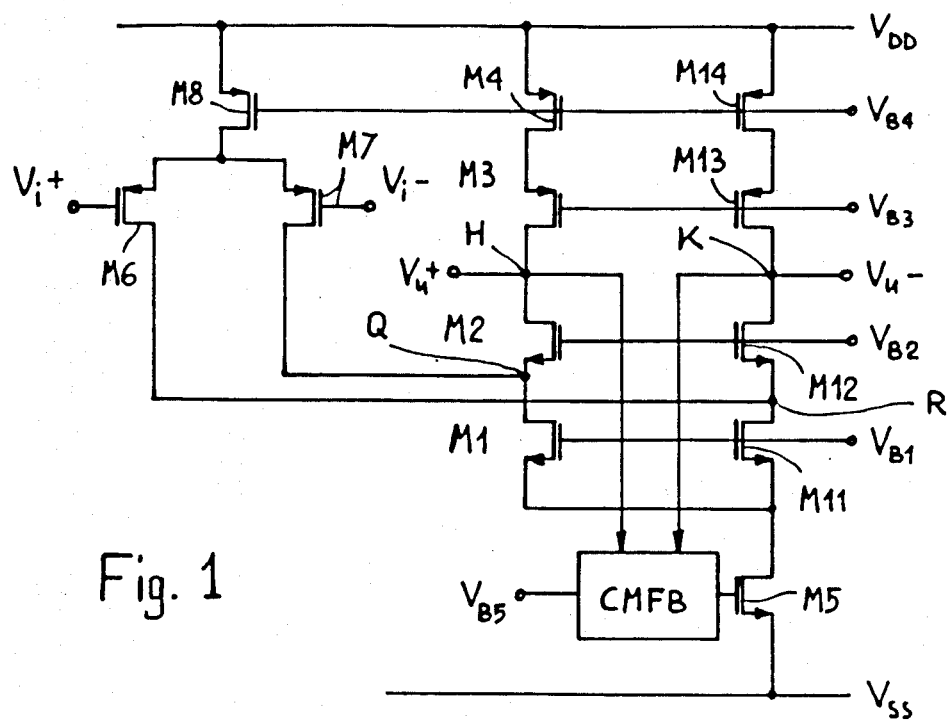
FIG. 1 is a circuit diagram of a known all-differential operational amplifier.

With reference to FIG. 1, a differential operational amplifier will be described, which constitutes the example of the prior art which is closest to the one of the invention. The amplifier is of the "folded cascode" type, with two circuit branches and a differential input stage.

A branch of the circuit comprises a first transistor M1 having an N channel, the drain of which is connected to the source of a second identical transistor M2. A third transistor M3, having a P channel, has its drain connected to the drain of the second transistor M2 and the source connected to the drain of a fourth transistor M4, the source of which is brought to a positive fixed supply voltage $V_{DD}$. The source of the first transistor M1 is connected to the drain of a transistor M5 having an N channel, the source of which is connected to a fixed negative supply voltage $V_{SS}$.

The gates of the four transistors are biased by respective fixed biasing voltages $V_{B1}$, $V_{B2}$, $V_{B3}$, $V_{B4}$.

The node Q between the transistors M1 and M2 is driven by the drain of a P-channel transistor M7 which belongs to a differential input stage which comprises, apart from said transistor M7, another symmetrical transistor M6, both having the sources fed by the drain of a transistor M8, also having a P channel, fed on the source by the supply voltage $V_{DD}$, and biased on the gate by the same voltage $V_{B4}$ which biases M4. The gates of the transistors M6 and M7 receive the input signals $V_i+$ and $V_i-$, i.e. respectively in direct and in inverted form.

A second branch of the "folded cascode" circuit comprises transistors M11, M12, M13, M14, identical to the transistors M1, M2, M3, M4 described above, and connected to each other and to the supply and biasing voltages in the same manner.

The node R between the transistors M11 and M12 is driven by the drain of the transistor M6 of the differential stage described above.

The drains H, K of the second transistors in the two circuit branches constitute the two output terminals of the amplifier, and the differential output signals $V_u+$ and $V_u-$ are furthermore connected to the inputs of a common-mode feedback circuit CMFB, per se known, biased by a voltage $V_{B5}$ which drives the transistor M5, to stabilize the common-mode of the outputs around a reference voltage, usually set at the ground level.

Each of the two transistors M6 and M7 forms a "folded cascode" with the respective branch of the associated circuit.

The known amplifier of FIG. 1 has the following remarkable features with respect to the prior two-stage amplifiers:

(a) the open-loop voltage gain is approximately equal;
(b) the stability is higher as the capacitive load increases;
(c) the settling time of the single stage is shorter;
(d) the excursion of the output voltage is almost equal, as long as the biasing voltages are selected as indicated hereinafter;
(e) the power dissipation is smaller;
(f) the equivalent input noise is slightly less;
(g) the rejection of disturbances in the power supply is comparable;
(h) the occupied area is smaller.

Figure 2:
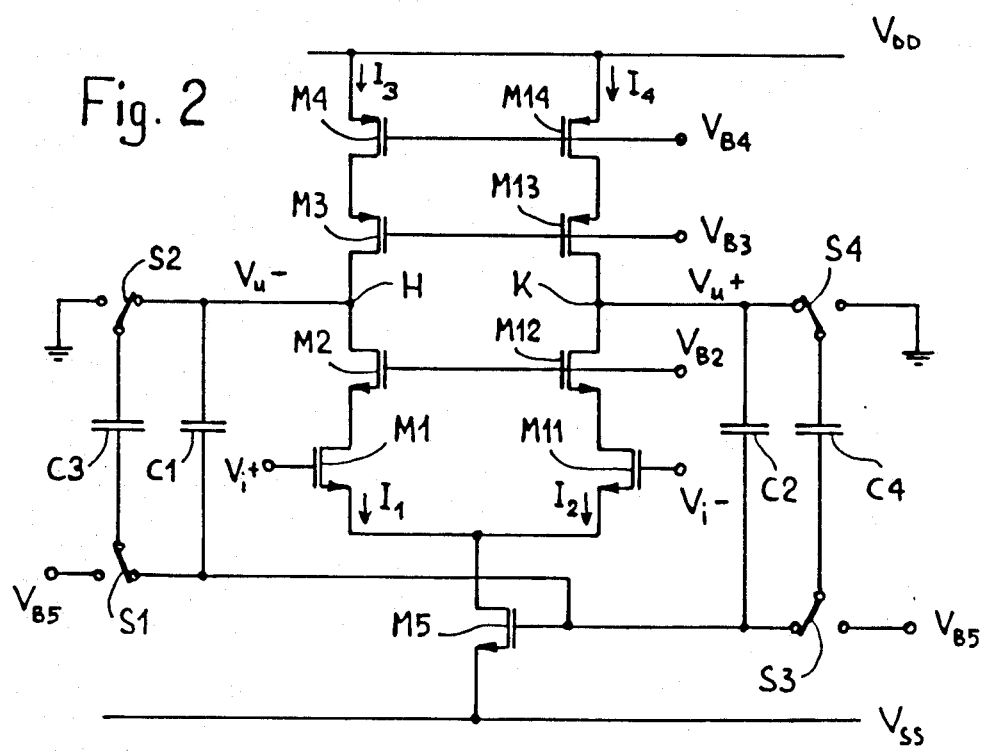
FIG. 2 is a circuit diagram of an all-differential operational amplifier according to a preferred embodiment of the invention.

With reference to FIG. 2, a preferred embodiment of an internal all-differential operational amplifier for CMOS integrated circuits will be described, which improves the known circuit FIG. 1. For simplicity, the same reference numerals of FIG. 1 will be employed for similar parts.

In a manner which is smaller to that of the amplifier of FIG. 1, the one of FIG. 2 also comprises two circuit branches, composed of transistors M1, M2, M3, M4, and respectively M11, M12, M13, M14, connected to each other and to the supply voltages in the same manner as the transistors of FIG. 1. The gates of the transistors M2, M3, M4, M12, M13, M14 are biased by the biasing voltages $V_{B2}$, $V_{B3}$, $V_{B4}$, generated in a conventional manner, while the gates of the transistors M1, M11 constitute the input terminals for the signal in the not-inverted and inverted form. Thus each of the two branches of the circuit forms a cascode stage.

The biasing voltages $V_{B2}$, $V_{B3}$, $V_{B4}$ are preferably restricted by such limits as to allow the widest possible excursion of the output signal. By terming $V_{GS}$ the gate-source voltage of the transistors of the circuit, and $V_{DSAT}$ the minimum saturation drain voltage ($V_{DSAT}=V_{GS}-V_T$, $V_T$ being the threshold voltage), these limits are:

$V_{B4}$ must be a $V_{GS}$ below $V_{DD}$;
$V_{B3}$ must be a $V_{GS}+V_{DSAT}$ below $V_{DD}$;
$V_{B2}$ must be a $V_{GS}+2V_{DSAT}$ above $V_{SS}$.

Furthermore, the voltage reference for the input signal must be a $V_{GS}+V_{DSAT}$ above $V_{SS}$, while the voltage reference $V_{B5}$ for the common-mode feedback circuit must be a $V_{GS}$ above $V_{SS}$.

With these limits on the biasing voltages, the allowable excursion range of the output signal spans from $V_{SS}+3V_{DSAT}$ on the negative to $V_{DD}-2V_{DSAT}$ on the positive.

The embodiment of FIG. 2 also comprises a common-mode feedback circuit CMFB, which in the preferred embodiment comprises two capacitors C1 and C2 connected between the respective output nodes H, K on one side and the gate of a transistor M5 on the other, and furthermore two capacitors C3 and C4, switched by double switches S1, S2, S3, S4 (by a clock which is not illustrated since it is known in the art of switched capacitors) alternately between the ends of the capacitors C1 and C2 and the biasing voltage $V_{B5}$. As is known to the expert in MOS technology, these switched capacitors are equivalent to resistors placed permanently parallel coupled to C1 and C2.

To understand the operation of the circuit of FIG. 2, it should be noted that, with a lack of signal, the total current $I_t$ generated by M5 is equally divided between the two branches. By terming $I_1$ and $I_2$ the two (identical) currents in M1 and M11, their value is adjusted by the common-mode feedback circuit until they become equal to $I_3$ and $I_4$. When this condition is true, the common-mode voltage of the outputs $V_u+$ and $V_u-$ (i.e., the value $(V_u++V_u-)/2$) is approximately the ground.

The presence of a differential signal $V_i$ will give rise to a variation in the currrents $I_1$ and $I_2$ in opposite directions, that is to say in M1 an extra I will circulate, in M11 the same I less; this differential in current will occur on the very high impedance of the output node (since it is applied to two parallel-coupled cascode circuits) and will produce two equal and opposite voltage signals. Obviously the common-mode (given by the semisum of the outputs) will remain unchanged, thus the circuit CMFB will not be influenced in any way by the operation of the differential amplifier, nor will the latter be influenced by the circuit CMFB.

Figure 3:
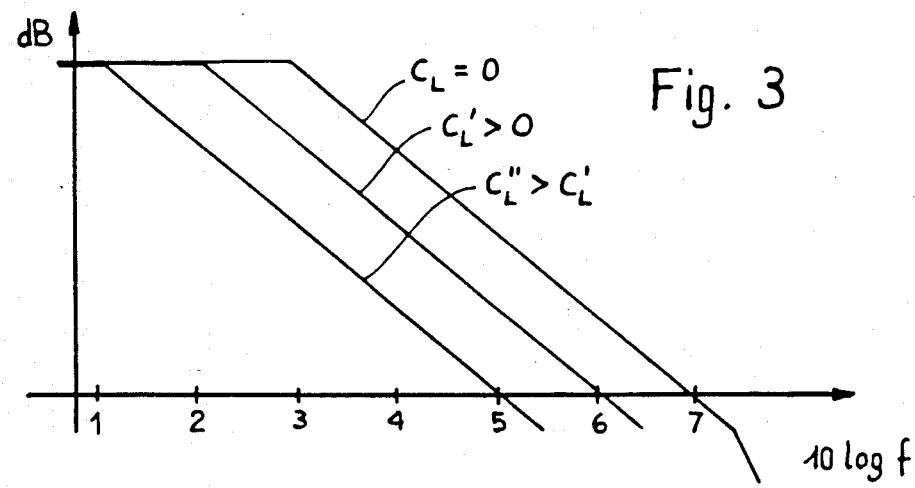
FIG. 3 is a Bode diagram indicating the operation of the amplifier of FIG. 1 as the load varies.

The capacitors of the common-mode feedback circuit (C1-C4) constitute a fixed internal load for the all-differential amplifier, and as a consequence, even in case of lack of an external load, the circuit is always stable, as is shown by the diagram of FIG. 3, which illustrates the Bode diagrams of the amplifier for external capacitive loads $C_L$, $C_L'$, $C_L''$ which increase starting from $C_L=0$.

Figure 4:
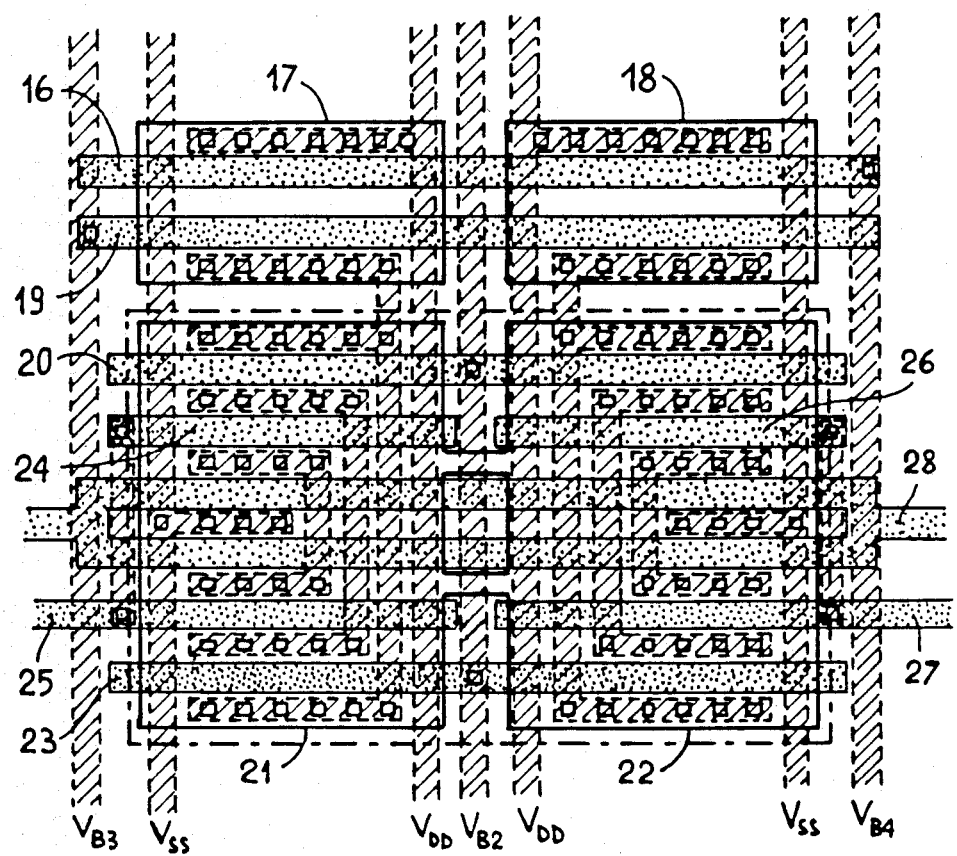
FIG. 4 is an exemplifying layout of an implementation of an amplifier according to the circuit diagram of FIG. 2.

In FIG. 4 is shown by way of example only a preferred layout of the all differential amplifier of FIG. 2. In the layout, the insulated regions are outlined with a thicker line. A region (or "well") with a inverted substrate polarity is defined by dot-and-dash lines. The shaded areas and those with a discontinuous border are metalizations and the dotted areas represent polycrystalline silicon, commonly termed "poly". The squares are contacts, i.e. holes between the insulating oxide coatings, in one case between the layers of superimposed semiconductor and metal, in the other case between the superimposed layers of poly and metal.

In FIG. 4 the metal buses are identified, which respectively convey the voltages $V_{DD}$, $V_{SS}$, $V_{B2}$, $V_{B3}$, $V_{B4}$. Considering the polycrystalline silicon, the bus or track 16 forms the gates of the transistors M4, M14 (respectively in the two insulated regions 17, 18) and similarly the bus 19 forms the gates of the transistors M3, M13. The bus 20 forms (respectively in the two insulated regions 21, 22) half of the gates of the transistors M2, M12, while the bus 23 forms the other halves of the gates of the same transistors.

The buses 24, 25 form together the gate of the transistor M1. The two buses are connected by a metalization connection, and of these, the bus 25 extends towards the rest (which is not shown) of the monolithic circuit to receive the not-inverted input signal $V_i+$. Similarly for the buses 26, 27, as far as the transistor M11 and the inverted input signal $V_i-$ are concerned.

Finally the split bus 28 forms the gate of the transistor M5, and extends towards the rest of the circuit to connect with the circuit CMFB (not included in the layout of FIG. 4) and with its biasing voltage $V_{B5}$.

On the grounds of the description given of FIG. 4 and of the circuital diagram of FIG. 2, the identification of the sources and drains of the various transistors will be obvious to the expert.

With respect to the known solution of FIG. 1, the amplifier according to the invention has several advantageous features, among which:

(a) the area occupied in the layout is smaller, both because three transistors are spared, and because a more compact embodiment of the layout itself can be obtained;

(b) the power dissipation is smaller, since only two branches convey current, instead of the four of the known embodiment;

(c) the maximum current supplied to the external load is determined both for the amplifier of FIG. 2 and for that of FIG. 1 by the current available in the output transistors (i.e., M3, M4, M13, M14), so the dynamic performance is comparable (or slightly better in the circuit according to the invention) despite the saving in dissipated power.

Conversely, it should be noted that whereas in the circuit of FIG. 1 the inputs can be referred to the ground, in the amplifier according to the invention the reference must be negative and have a value which is appropriately set by a biasing present on the integrated circuit, as described above. However this restriction does not represent a limitation, since it is not required of internal operational amplifiers to "withstand" common-node input signals. Indeed, the inputs are always very close to a fixed reference value, and it does not matter what this value is.

Figure 5:
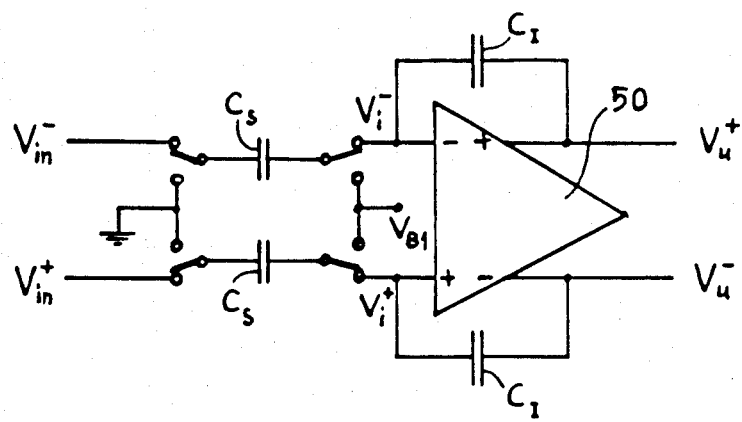
FIG. 5 is an example of an application of an amplifier according to the invention for forming an all-differential integrator.

In FIG. 5, with 50 is indicated the entire amplifier, the diagram of which is illustrated in FIG. 2, employed in the implementation of an integrator. Between the outputs and the inputs, respectively $V_u+$ and $V_i-$ on one side, and $V_u-$ and $V_i+$ on the other, are connected respective integration capacitors $C_I$. The input signals $V_{in}-$ and $V_{in}+$ are applied to the amplifier through respective switched capacitors $C_S$, which lead to the biasing voltage $V_{B1}$, provided in a manner similar to the one described for the switched capacitors of FIG. 2.

A preferred embodiment of the invention has been described, but naturally it is susceptible of equivalent modifications and variations, within the teachings given, without departing thereby from the scope of the invention.

We claim:

1. An internal all-differential operational amplifier for integrated circuits of the CMOS type, comprising two CMOS cascode circuits, identical to each other, each having a first and a second transistors with a channel having a first polarity and a third and fourth transistors with a channel having the opposite polarity, the drain of the first transistor being connected to the source of the second transistor, the drain of the fourth transistor being connected to the source of the third transistor, the drains of the second and of the third transistor being connected to each other and forming one of the output terminals of said amplifier, the sources of the first transistors of the two cascode circuits being both connected to the drain of a fifth transistor having said first polarity, the source of which is fed by a first supply voltage, and the sources of the fourth transistors of the two cascode circuits being fed by a second supply voltage, the two input signals being applied, by means of capacitor and switching means simulating input resistors, to the respective gates of said two first transistors, the other three gates of each cascode circuit being biased by respective fixed biasing voltages, the gate of the fifth transistor being biased by a dedicated fixed biasing voltage by means of capacitor and switching means constituting a common-mode feedback circuit.

2. An all-differential operational amplifier according to claim 1, wherein the biasing voltage of the gates of the first transistors of said two cascode circuits is above said first supply voltage by a value which is equal to the gate-source voltage plus the value of the minimum saturation drain voltage.

3. An all-differential operational amplifier according to claim 2, wherein the biasing voltage of the gates of said third transistors of said two cascode circuits is below said second supply voltage by a value which is equal to the gate-source voltage plus the value of the minimum saturation drain voltage.

4. An all-differential operational amplifier according to claim 3, wherein the biasing voltage of the gates of said fourth transistors of said two cascode circuits is below said second supply voltage by a value equal to the gate-source voltage.

5. An all-differential operational amplifier according to claim 1, wherein the biasing voltage which drives the gate of said fifth transistor through the common-mode feedback circuit is above said first supply voltage by a value which is equal to the gate-source voltage.

6. An all-differential operational amplifier according to claim 5, wherein said common-mode feedback circuit comprises two fixed capacitors, each having one end connected to the gate of said fifth transistor and the opposite end respectively connected to one of the output terminals of the differential amplifier, and two further switched capacitors having the ends connected to respective controllable double switches to alternately place said further capacitors parallel-coupled with said fixed capacitors and connected between the ground and a biasing voltage.

* * * * *